(12) United States Patent
Rozenblit et al.

(10) Patent No.: US 9,231,534 B2
(45) Date of Patent: Jan. 5, 2016

(54) OPTIMAL ENVELOPE TRACKING REFERENCE WAVEFORM GENERATION

(71) Applicant: BROADCOM CORPORATION, Irvine, CA (US)

(72) Inventors: Dmitriy Rozenblit, Irvine, CA (US); Vipin Kumar Aggarwal, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 79 days.

(21) Appl. No.: 14/060,171

(22) Filed: Oct. 22, 2013

(65) Prior Publication Data

US 2015/0091655 A1 Apr. 2, 2015

Related U.S. Application Data

(60) Provisional application No. 61/884,830, filed on Sep. 30, 2013.

(51) Int. Cl.
*H01Q 11/12* (2006.01)
*H03F 3/19* (2006.01)
*H03F 1/02* (2006.01)
*H03F 3/24* (2006.01)

(52) U.S. Cl.
CPC ............... *H03F 3/19* (2013.01); *H03F 1/0227* (2013.01); *H03F 3/245* (2013.01); *H03F 2200/102* (2013.01); *H03F 2200/451* (2013.01)

(58) Field of Classification Search
CPC ............ H04B 1/62; H03F 1/02; H03F 1/3241
USPC ........................ 455/91, 114.3, 115.1, 127.1
See application file for complete search history.

(56) References Cited

U.S. PATENT DOCUMENTS

2006/0209984 A1* 9/2006 Kenington ................ 375/297
2014/0028370 A1* 1/2014 Wimpenny ................ 327/318

* cited by examiner

*Primary Examiner* — Tuan Pham
(74) *Attorney, Agent, or Firm* — Garlick & Markison; Randy W. Lacasse

(57) ABSTRACT

A method and apparatus is provided to improve upon the efficiency of a power amplifier. Suitable hardware/software in the form of circuitry, logic gates, and/or code functions to construct an envelope tracking waveform of an input communications signal and modulate the input supply voltage based on power amplifier circuitry operational parameters such as slew rates.

20 Claims, 9 Drawing Sheets

US 9,231,534 B2

OPTIMAL ENVELOPE TRACKING REFERENCE WAVEFORM GENERATION

CROSS REFERENCE TO RELATED PATENTS/INCORPORATION BY REFERENCE

The present U.S. Utility Patent Application claims priority pursuant to 35 U.S.C. §119(e) to the following U.S. Provisional Patent Application Ser. No. 61/884,830, entitled "Optimal Envelope Tracking Reference Waveform Generation," filed Sep. 30, 2013, pending, which is hereby incorporated herein by reference in its entirety and made part of the present U.S. Utility patent application for all purposes.

BACKGROUND

1. Technical Field

The present disclosure described herein relates generally to wireless communications and more particularly to processes and circuits used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP (3rd Generation Partnership Project), 4GPP (4th Generation Partnership Project), LTE (long term evolution), LTE Advanced, RFID, IEEE 802.11, Bluetooth, AMPS (advanced mobile phone services), digital AMPS, GSM (global system for mobile communications), CDMA (code division multiple access), LMDS (local multi-point distribution systems), MMDS (multi-channel-multi-point distribution systems), and/or variations thereof.

Depending on the type of wireless communication system, a wireless communication device, such as a cellular telephone, smartphone, two-way radio, tablet, personal digital assistant (PDA), personal computer (PC), laptop computer, home entertainment equipment, RFID reader, RFID tag, et cetera communicates directly or indirectly with other wireless communication devices. For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna. As communications network capacities evolve, energy consumption is readily becoming an important factor. Recent developments in envelope tracking are aimed at consuming energy more efficiently.

BRIEF DESCRIPTION OF THE DRAWING(S)

DETAILED DESCRIPTION

Figure 1:
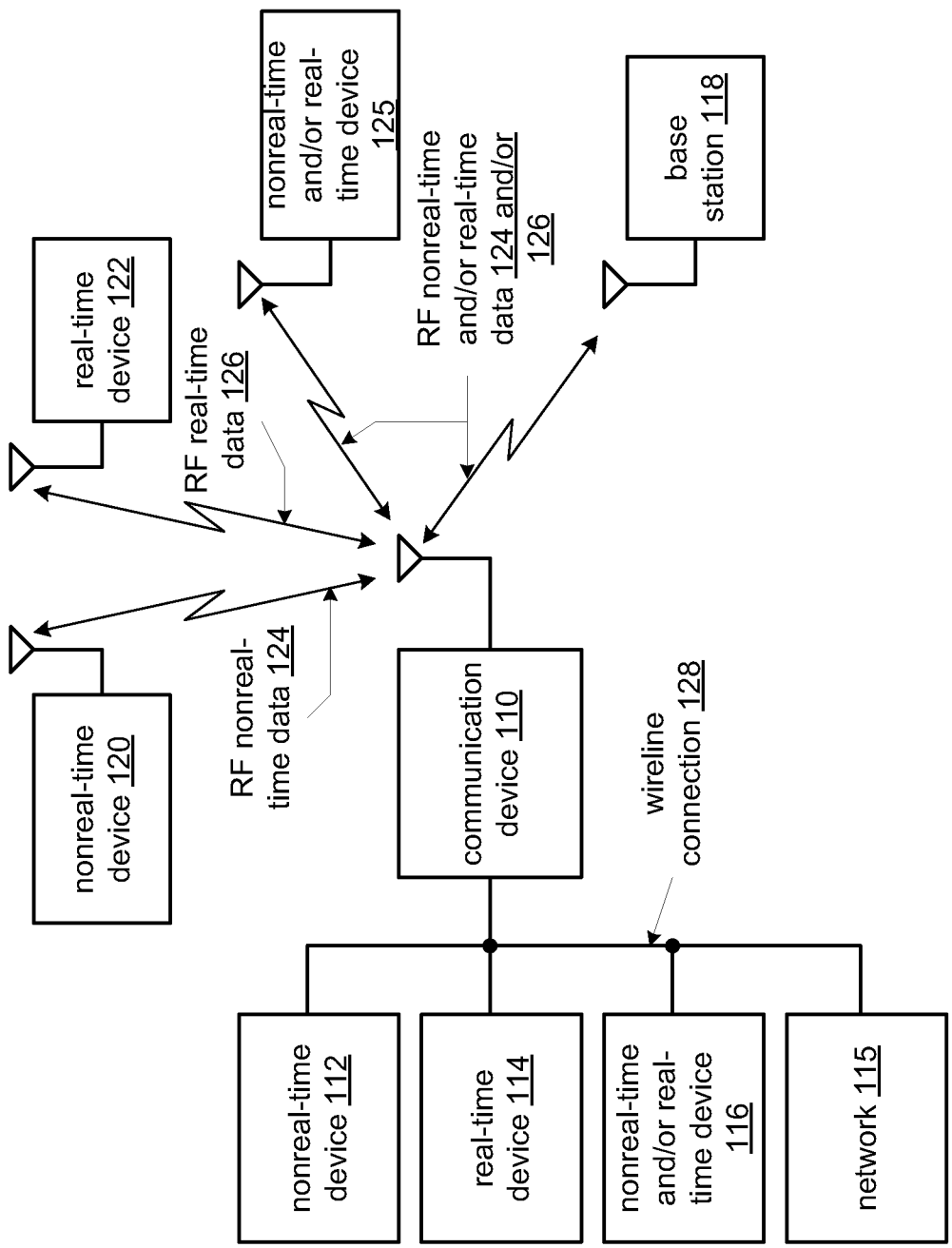
FIG. 1 is a schematic block diagram of an embodiment of a wireless communication system in accordance with the present disclosure.

FIG. 1 is a schematic block diagram of a communication system in accordance with the technology described herein. In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the technology described herein, the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In one embodiment, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

Figure 2:
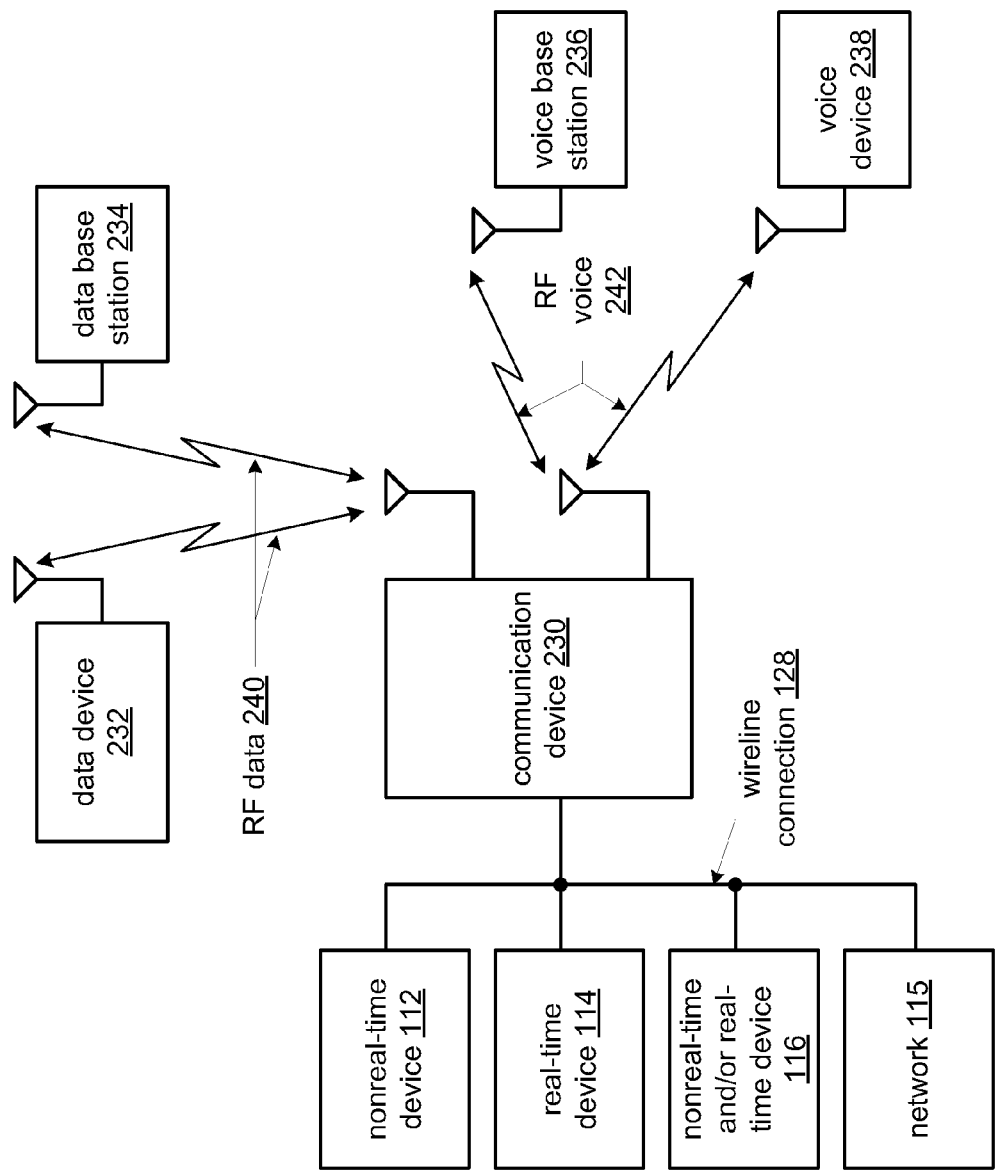
FIG. 2 is a schematic block diagram of another embodiment of a wireless communication system in accordance with the present disclosure.

FIG. 2 is a schematic block diagram of an embodiment of another communication system in accordance with the present disclosure. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
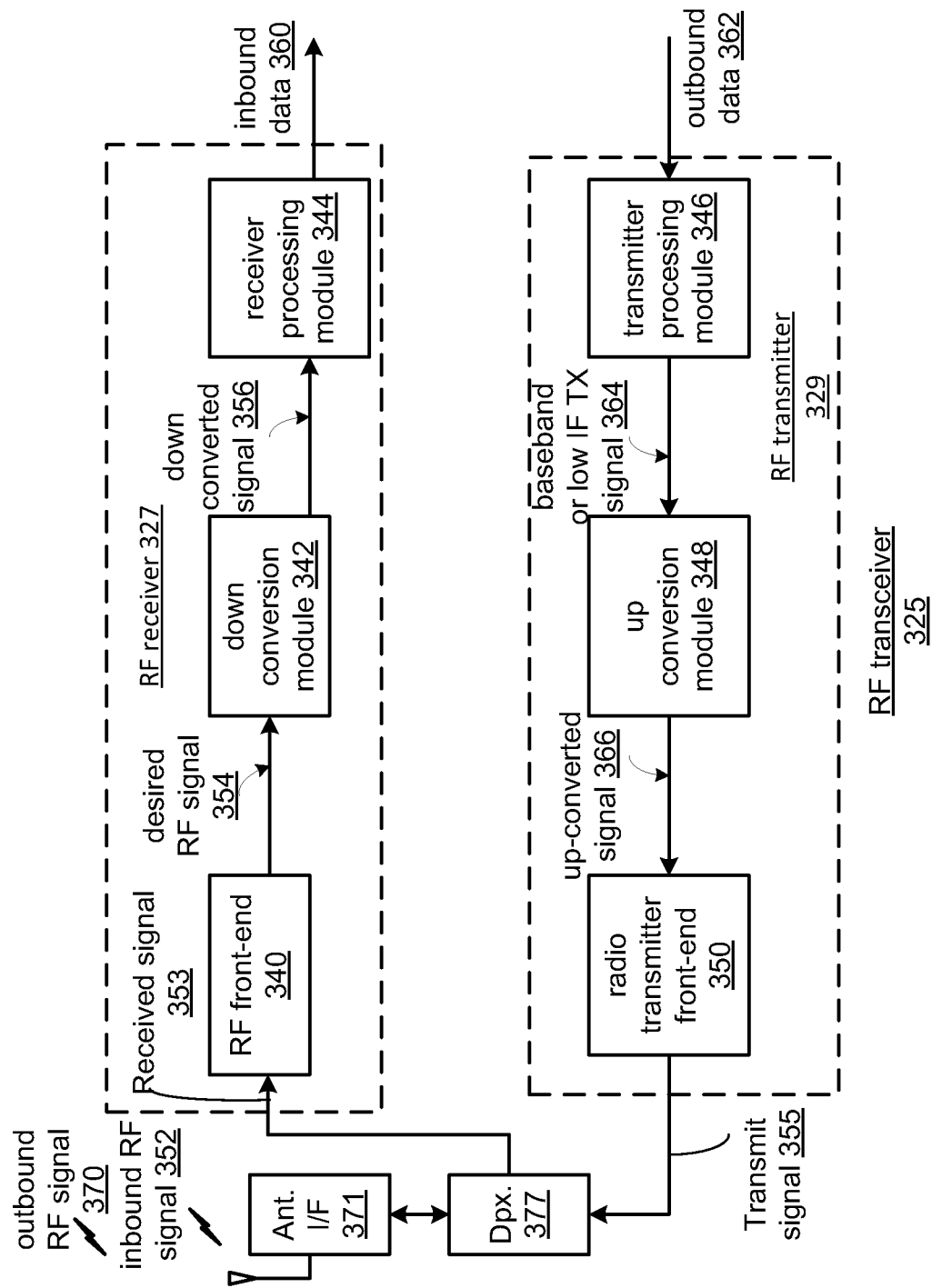
FIG. 3 is a schematic block diagram of an RF transceiver for a wireless communication system in accordance with the present disclosure.

FIG. 3 is a schematic block diagram of an embodiment of a wireless transceiver 325 in accordance with the present disclosure. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure (e.g., MIMO (multiple-input multiple-output)) that includes two or more antennas.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the technology described herein, receiver processing module 344 and transmitter processing module 346 can be implemented via use of a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

Wireless communication requirements are becoming increasingly more burdensome to efficient energy consumption. As communication network capacities grow, energy is consumed by the communication devices at a more rapid rate. One way to limit energy consumption is to improve communication circuitry within the communication devices to consume energy more efficiently. On approach of improving energy consumption is through envelope tracking.

Envelope tracking (ET) describes an approach to RF amplifier design in which the power supply voltage applied to the power amplifier (PA) is constantly adjusted (modulated) to ensure that the amplifier is operating at peak efficiency for the given instantaneous output power requirements. Power amplifiers operating with a constant supply voltage become less efficient as the crest factor of the signal increases as the amplifier spends more time operating below peak power and, therefore, spends more time operating below its maximum efficiency.

Figure 4:
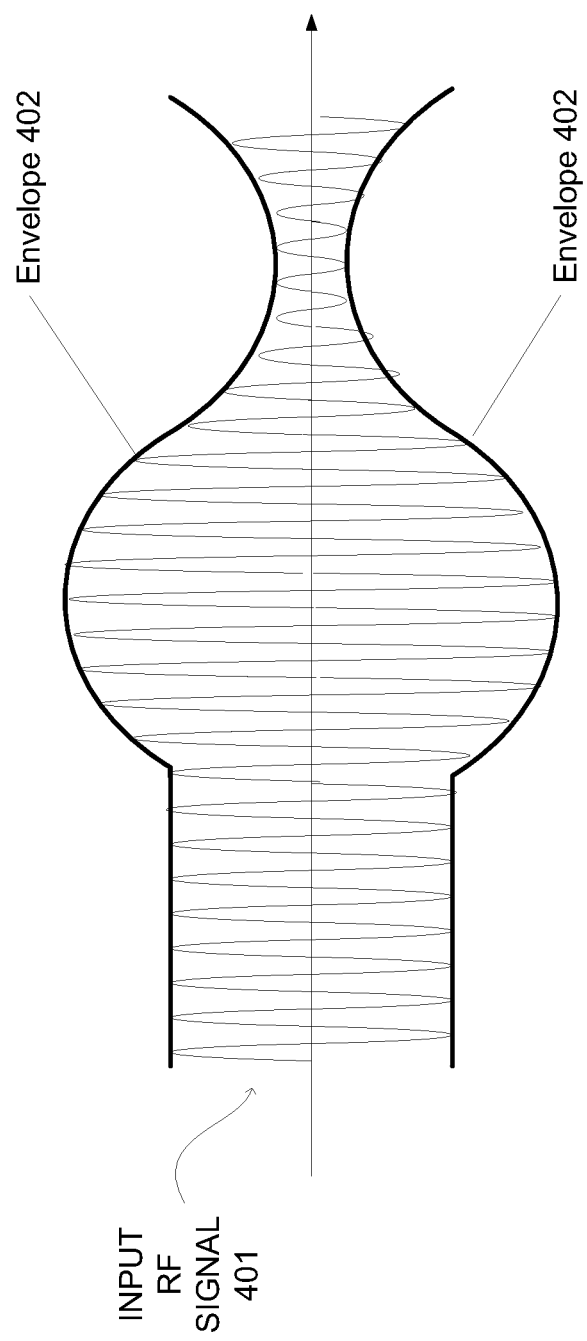
FIG. 4 illustrates ideal envelope generation and tracking for an input RF signal for a power amplifier in accordance with the present disclosure.

FIG. 4 illustrates ideal envelope generation and tracking for an input RF signal of a power amplifier in accordance with the present disclosure. Suitable hardware/software in the form of circuitry, logic gates, and/or code functions (not shown) is used to generate and track envelope 402 of input RF signal 401. An ideal envelope 402 represents the upper (peaks) and lower (troughs) boundaries of RF input signal 401. Tracked points along the envelope curve are synchronized in time with the corresponding points along the input signal.

Figure 5:
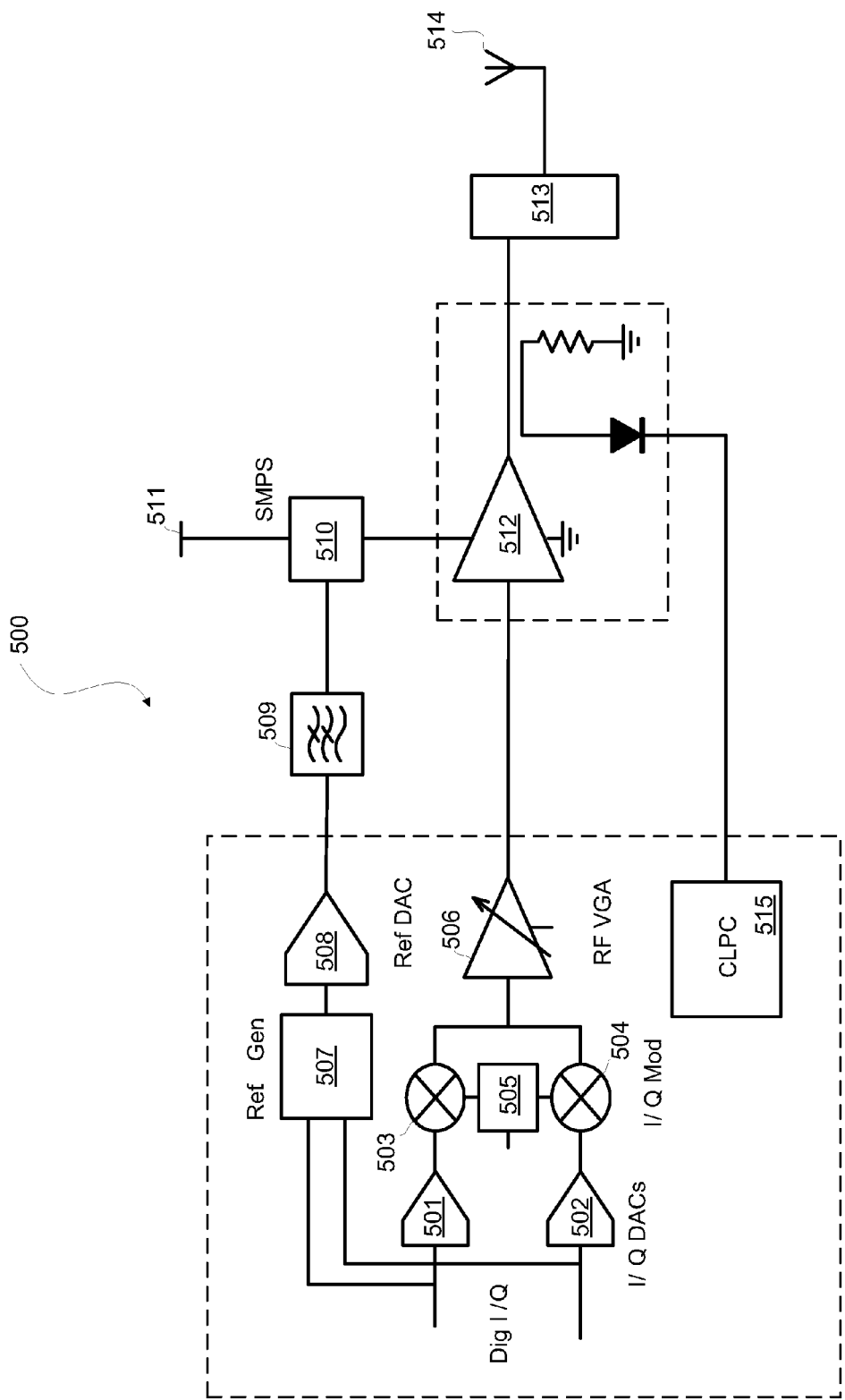
FIG. 5 illustrates an embodiment of a block diagram of an ET transmitter in accordance with the present disclosure.

FIG. 5 illustrates an embodiment of a block diagram of an ET transmitter in accordance with the present disclosure. Transmitter 500 includes dynamic control of power amplifier's (PA 512) supply voltage 511 through switched-mode power supply (SMPS) 510. The supply voltage 511 is controlled as a function of a tracked signal envelope produced by a reference generator to increase the overall energy efficiency of the transmitter as further described hereafter.

Transmitter 500 provides for a digital signal processor (not shown) producing a digital baseband signal (including in-phase (I) and quadrature (Q) components). The digital baseband signal is converted from digital to analog by digital-to-analog converters (DAC) 501 and 502 and up-converted by mixers 503 and 504 coupled to local oscillator (LO) 505 to provide a desired transmission frequency of an RF transmission signal. The RF transmission signal is pre-amplified by variable gain amplifier (VGA) 506 and passed for amplification to PA 512 before it is passed through duplexer (e.g., filter) 513 and transmitted by antenna 514.

The digital baseband signal is also provided to a reference pathway for generation of the tracked envelope (reference waveform). The digital baseband signal is passed through reference generator 507 and reference DAC 508 where the digital baseband signal is converted into an ET waveform using known ET techniques. The ET waveform is filtered by low pass filter 509 where the filtered ET waveform is an input for the SMPS 510 where it is converted by a DC/DC converter (switcher) producing a modulated PA supply waveform. The RF signal output from RF VGA 506 is amplified by PA 512 according to the supply voltage applied to PA 512 to produce an amplified output signal for transmission through duplexer 513 and antenna 514. The PA supply waveform is applied to PA 512 in synchronization with the RF signal. Closed loop power is controlled by CLPC (closed loop power control) 515.

Envelope tracking allows for substantial TX efficiency improvements (especially at higher power levels). With higher peak-to-average ratios (PAR), the efficient improvements are even higher. However, traditional implementation of ET may substantially limit (or even negate) the efficient improvements. For example, traditional ET implementation issues include misalignment of both static and dynamic delays between the ET supply waveform and the RF envelope waveform. Misalignments potentially cause degradation in both adjacent channel leakage ratio (ACLR) and error vector magnitude (EVM). For another example, amplitude modulation/amplitude modulation (AM/AM) and amplitude modulation/pulse modulation (AM/PM) products produced during ET operation substantially impact EVM and spectral purity of the TX and increase TX noise emitted in the RX band (when implemented in a transceiver).

In embodiments of the technology described herein, an ET waveform is constructed to closely follow the RF signal envelope on the PA supply. The ET waveform is constructed in such a way that it sets the operation mode of the transmitter in the "sweet spot" with respect to the required signal bandwidth, complexity of the switcher implementation and the attainable benefits in the average supply current. The ET reference waveform construction is based on anticipated limitations in the ET supply generation and supply limitations of the particular PA. The parameters taken into consideration are the amplifier ramp-up (attack rate) and ramp-down (decay rate) slew rates as well as a dynamic time overlap between the RF signal (envelope) and the PA supply waveforms. In one embodiment, the RF signal is delayed by a small period of time (e.g., 1 microsecond) allowing the ET reference generator time to analyze the modulation of an RF signal to be amplified.

The ET (reference) waveform is generated by passing the RF envelope information through a reference generator which includes an emulation block imposing dynamic limitations on the slew rates according to the utilized ET supply source configuration. In one embodiment, dynamic limitations include: noise, agility of the switcher and the qualities of a discharge capacitor of the PA. With advance knowledge of the transmit signal caused by the delay in the RF signal, the parameters of the ET waveform synthesis block could be altered (from slot-to-slot) as a function of the signal bandwidth (e.g., number of resource blocks (RBs) in LTE) and/or PAR of the signal. Construction of the ET waveform in this manner preserves the benefits of ET by maintaining alignment between the RF and ET signal. Due to the dynamic slew rate reduction, the bandwidth of the synthesized ET reference signal is substantially narrower than the entire AM bandwidth of the signal. The delayed RF signal provides the ET waveform generation to closely follow the RF signal, avoiding high attack rates (causing high power consumption) and eliminating forced discharge of the capacitor.

Figure 6:
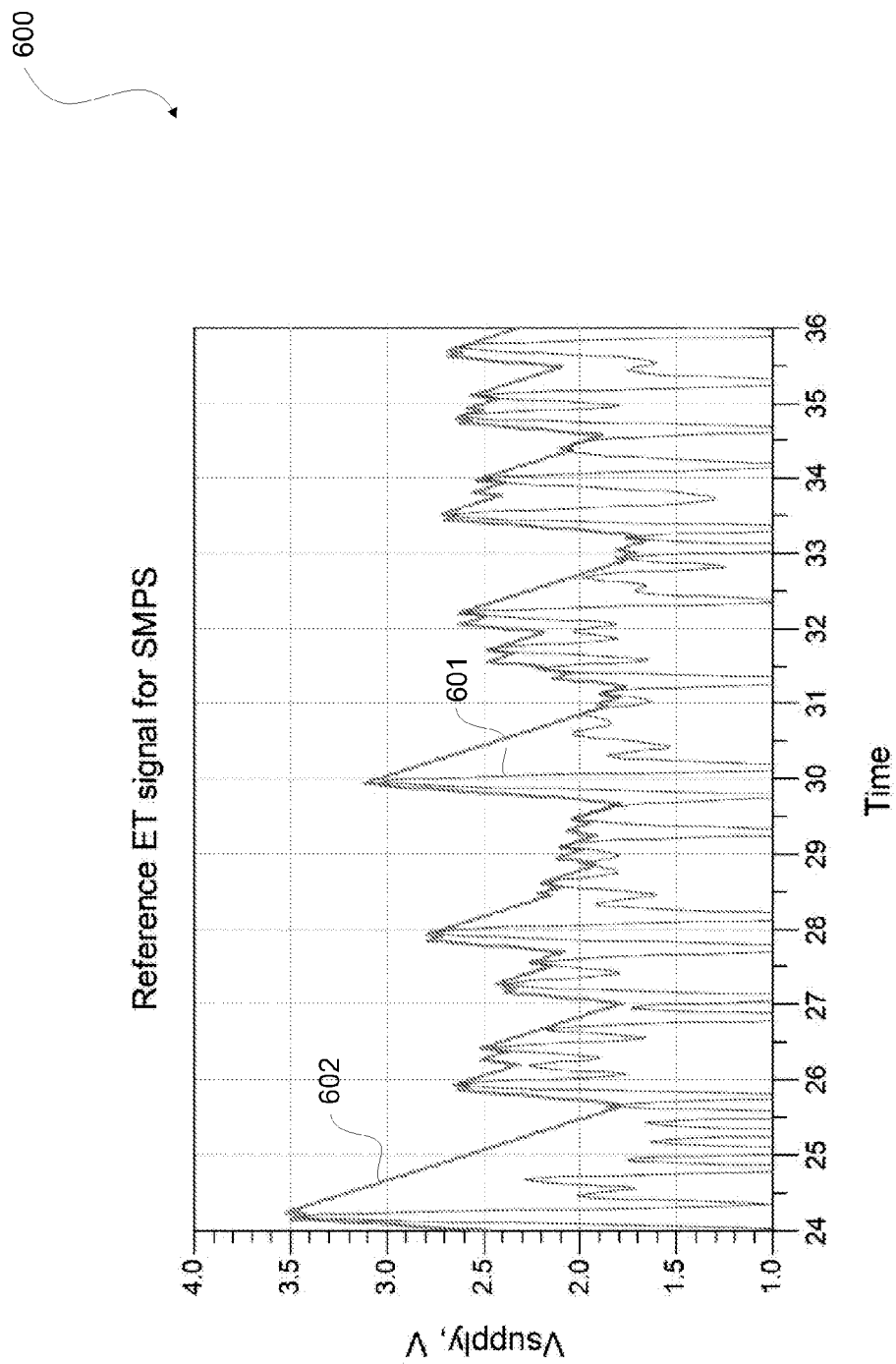
FIG. 6 illustrates an example embodiment of a plot for an ideal envelope and a reference envelope in accordance with the present disclosure.

FIG. 6 illustrates an example embodiment of a plot for an ideal envelope and a generated reference envelope in accordance with the present disclosure. Plot 600 of frequency (MHz) versus decibel (dB) provides for ideal envelope (RF envelope) 601 for WCDMA signal that is used to generate reference envelope 602 for a switcher. As shown, reference envelope 602 does not accurately follow the troughs of the RF envelope, though there is a sufficient overlap at the peaks. An envelope is tracked using a reference waveform having a fast rise time, a slower fall time and a minimal value and thereafter shaping it according to the limitations of the power supply circuitry for the transmitter as will be described in more detail hereafter.

Figure 7:
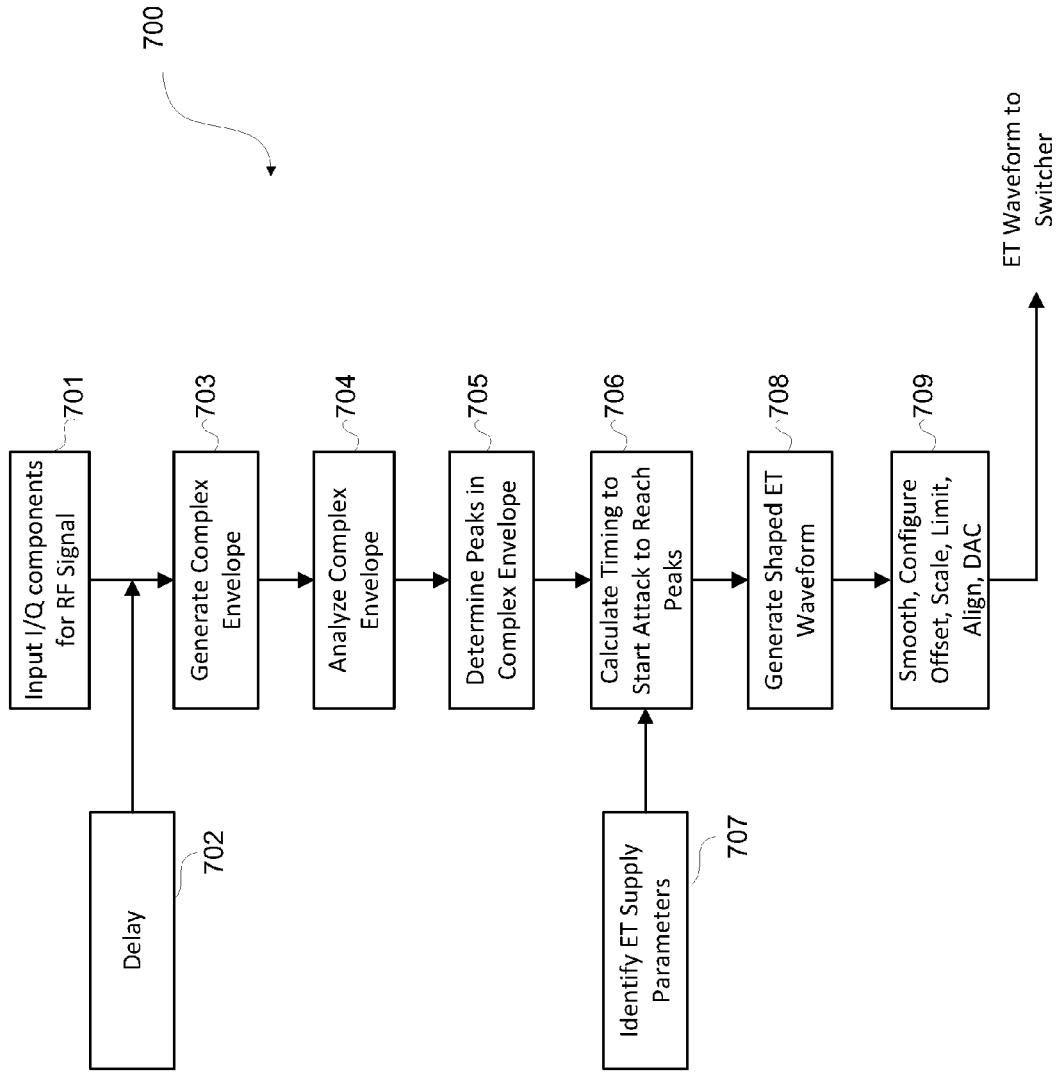
FIG. 7 illustrates an embodiment of a flow chart for the process of constructing an ET waveform in accordance with the present disclosure.

FIG. 7 illustrates an embodiment of a flow chart for the process of constructing an ET waveform in accordance with the present disclosure. Process 700 begins with an input of I/Q baseband components (samples) in step 701. The I/Q baseband components are used to create both an RF signal for transmission and the complex envelope for ET of the RF signal. In step 702, a delay (e.g., 1 microsecond) is introduced into a main RF signal transmit path to create an opportunity for the ET waveform synthesis path to analyze the waveform for optimal ET waveform creation.

In step 703, a complex envelope (e.g., ideal) of the waveform is created using known methods. In step 704, the complex envelope is analyzed to provide advanced knowledge of the RF signal. As peaks in the RF transmission signal have the highest power, in step 705, the peaks are determined. In step 707, system (operational) parameters (e.g., ET supply parameters) are determined. System parameters include, but are not limited to: slew rates (the maximum rate at which an amplifier can respond to an abrupt change of input level) to include attack rate (increase) and decay rate (decrease), capacitor size and discharge rate, noise and switcher agility (e.g., speed).

The complex envelope typically does not account for the system parameters. For example, the slew rates of the complex envelope may not provide the most efficient PA supply and, therefore, consume energy inefficiently (e.g., by forcing a high slew rate to obtain peaks or forced capacitor discharge to reach troughs). In step 706, a time is calculated at which to start attack times (initiate amplification using power amplifier circuitry) to adequately reach each peak taking into account the system parameters (such as slew rate).

In step 708, a shaped ET waveform is generated. Shaping of the complex envelope produces the ET envelope having been configured to account for the various system parameters that cause inefficient operation. For example, the attack rate of the ET envelope is adjusted to fit the switcher profile. Implementing a maximum attack rate for a switcher typically consumes energy inefficiently often using a rapid power increase to reach the maximum attack rate. The rapid power increase typically goes above the power saturation point for the PA where the unused energy is lost. Adjusting the attack rate of the ET envelope as to avoid the maximum attack rate of the switcher profile prevents energy loss and increases operational efficienly. For yet another example, the decay rate is adjusted to prevent forced discharge of the discharge capacitor. With the adjusted decay rate the discharge capacitor discharges naturally, avoiding the inefficient energy waste of forced discharge. As noted earlier, accurately reaching troughs is varied as it is based on the attack start times to reach the next peak. For example, when in the decay mode, if a designated time to start an attack mode to reach a peak is traversed, the downward decay is stopped in favor of the attack mode and therefore may not closely match the trough bottoms (less decay than ideal complex envelope). In one embodiment, the ET envelope is shaped where the peaks are equal or higher than the peaks of the complex envelope. Shaping the ET envelope so that the peaks are equal or higher than the peaks of the complex envelope ensures that the peaks are accurately tracked.

In step 709, various refining steps are performed, such as, but not limited to, smoothing (e.g., configurable low pass filtering), adjustments for offset and scale, upper and lower waveform limits, and alignment of the ET waveform to the RF transmission signal. The aligned ET waveform is then passed to the switcher in the switched-mode power supply to modulate the PA in synch with the amplification of the RF transmission signal.

Figure 8:
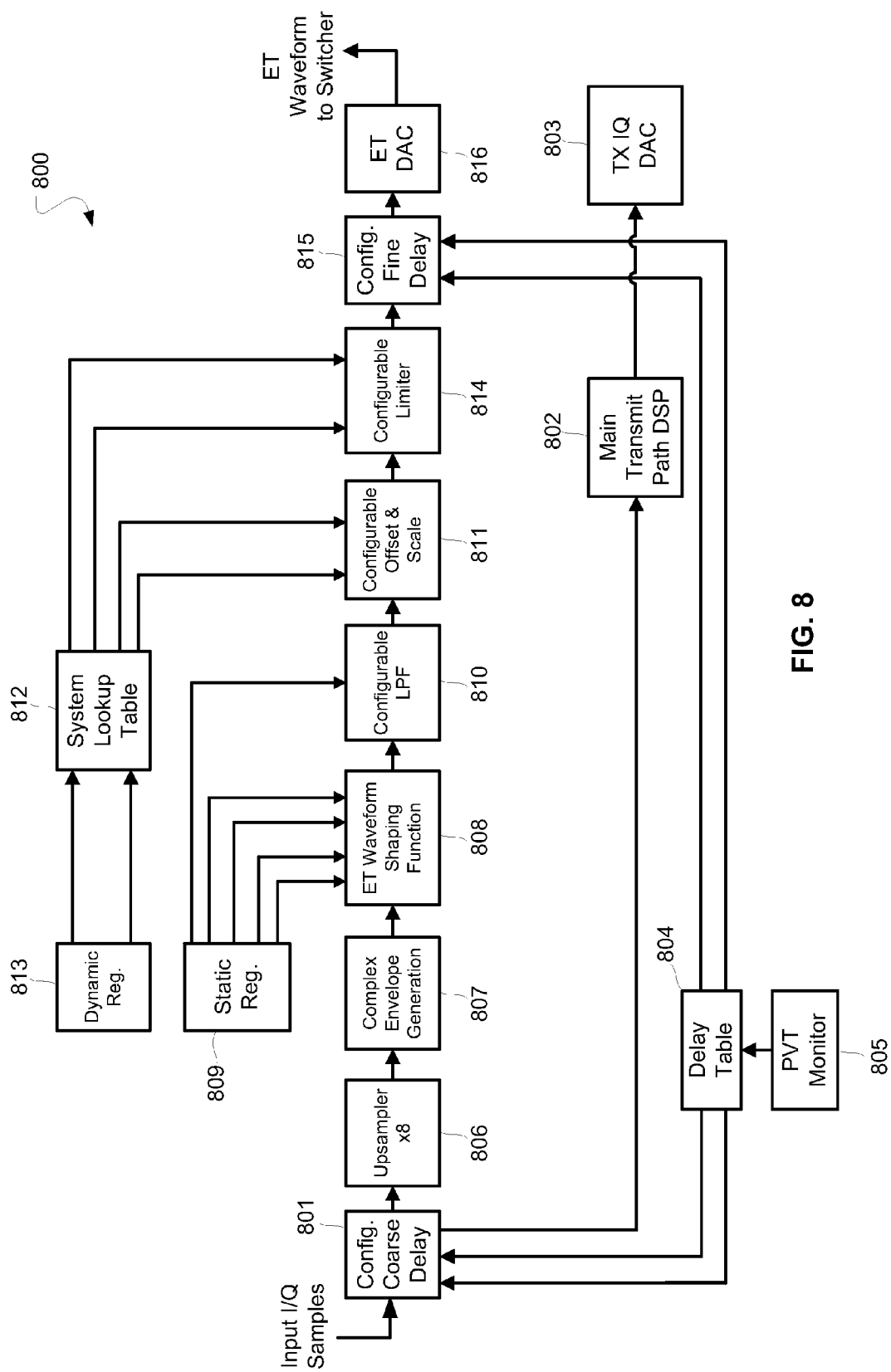
FIG. 8 illustrates an embodiment of a block diagram of a reference generator including digital signal processor (DSP) architecture for ET waveform generation (synthesis) in accordance with the present disclosure.

FIG. 8 illustrates an embodiment of a block diagram of a reference generator including digital signal processor (DSP) architecture for ET waveform generation (synthesis) in accordance with the present disclosure. DSP architecture 800 takes an input baseband signal (including I/Q components) for constructing an ET waveform for the SMPS. The input baseband signal is input to configurable coarse delay block 801 for configuring a delay between the ET waveform and the RF transmission signal. Configurable coarse delay block 801 is coupled to main RF transmit path DSP 802 for eventual analog conversion through TX IQ DAC 803. Additionally, configurable coarse delay block 801 is coupled to delay table 804 providing inputs for course and fine (815) delays.

The input baseband signal passed from configurable coarse delay 801 to up-sampler 806 where the sampling rate of the input baseband signal is increased. In one example embodiment, the sampling rate is increased 8 times, however, other sampling rates are considered within scope of the technology described herein. The input baseband signal is passed to complex envelope generation block 807 where a complex envelope is generated. In one embodiment, complex envelope generation is based on a look-up table (LUT) and is shared with the CLPC to reduce hardware complexity.

The complex envelope is passed to ET waveform shaping function block 808 to shape the complex envelope according to the system limitations. ET waveform shaping function block 808 is coupled to static regulation block 809 which provides as inputs to the ET waveform shaping function block 808, attack rate and decay rate information. In one embodiment, an input delay to prevent decay on wide peaks and additionally an envelope delay (to control attack start time relative to ideal envelope) is also provided to the ET waveform shaping function block by static regulation 809. ET waveform shaping function block 808 generates a low complexity, custom reference envelope (ET envelope) providing balance to ACLR requirements and current power savings targets. The ET shaped envelope is passed to configurable low pass filter (LPF) 810 to provide smoothing. In one embodiment, the filter bandwidth (BW) for configurable LPF 810 is selected by static regulation 809, which is also coupled to configurable LPF 810.

The smoothed ET shaped envelope is provided to configurable offset and scale block 811 for dynamic power control. Configurable offset and scale block 811 is coupled to system LUT 812 and dynamic power regulation block 813. Dynamic power regulation block 813 provides target power and a peak-to-average power ratio (PAPR) dependent base address to system LUT 812. The dynamic power control mechanism is extended to allow dynamic slot-to-slot scaling and offset of the ET envelope depending on the transmitter power and PAPR. Configurable limiter 814, coupled to an output of the configurable offset and scale block 811 and system LUT 812, provides an upper and lower limit for the ET envelope. The upper limit prevents an output from exceeding the switcher maximum rate while the lower limit prevents AM/PM degradation of the ET envelope.

As previously discussed, fine delay alignment adjustments to the ET envelope are performed by configurable fine delay block 815. Configurable fine delay block 815 is coupled to delay table 804. In one embodiment, delay table 804 is coupled to process, voltage and temperature (PVT) monitor 805 allowing for precise alignment between the switcher output (PA supply waveform) and PA input RF transmission signal where the delays are adjusted with PVT readings from PVT monitor 805. Depending on the environmental conditions, the delay table data is used as inputs to modify the coarse/fine delay settings in the course delay block 801 and configurable fine delay block 815.

The ET envelope produced from configurable fine delay block 815 is converted to an ET waveform by ET DAC 816 where it is provided to the switcher (e.g., 510). The switcher is configured to switch the power supply according to the ET waveform. The high resolution ET waveform enables low cost external filtering and precise delay control.

Figure 9:
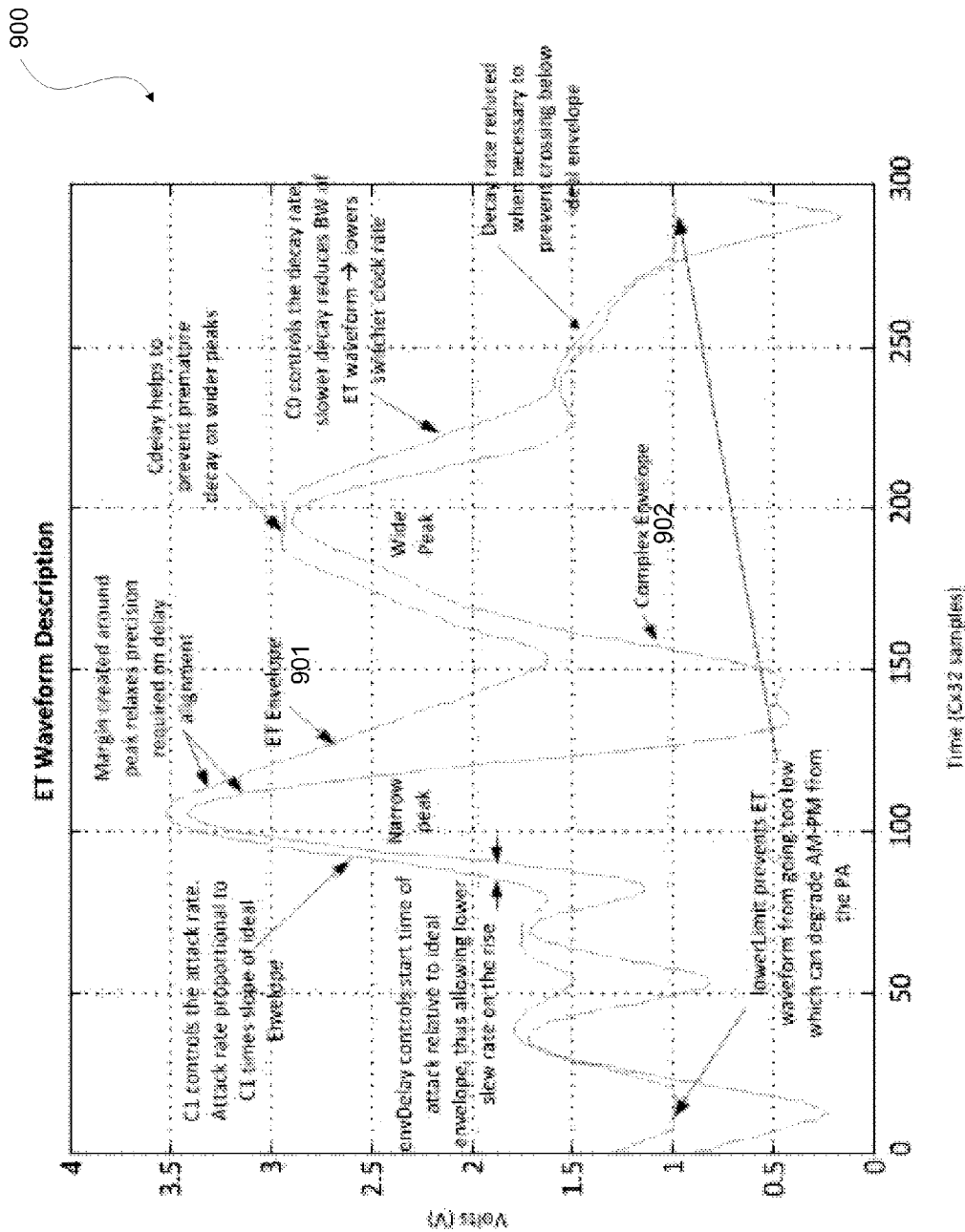
FIG. 9 illustrates an example plot for an ET envelope and a complex envelope in accordance with the present disclosure.

FIG. 9 illustrates an example plot for an ET envelope and a complex envelope in accordance with the present disclosure. Plot 900 of time versus volts (V) shows ET envelope 901 and complex envelope 902. Envelope delay (envDelay) controls a start time of the attack relative to complex envelope 902 allowing for a lower slew rate on the rise. An attack rate is provided by static regulation block 809 to ET waveform shaping function block 808 of FIG. 8. The attack rate is proportional to the attack rate (C1) and the slope of complex envelope 902. In one embodiment, the attack rate is limited by the PA.

Static regulation block 809 also controls the decay rate (C0). A slower decay rate, for example, reduces the bandwidth of the ET waveform effectively lowering the switcher rate. In one embodiment, the decay rate is reduced at a point when ET envelope 901 and complex envelope 902 begin to merge to prevent crossing of the two envelopes.

The margin created around the peak of the narrow peak between ET envelope 901 and complex envelope 902 relaxes traditional precision requirements on delay alignments. The delay (Cdelay), created between the ET envelope and the complex envelope helps to prevent premature decay on wider peaks. Cdelay is also provided to ET waveform shaping function block 808 by static regulation block 809 of FIG. 8.

FIG. 9 also shows a lower limit (lowerLimit) of the ET envelope to prevent the produced ET waveform from going too low, degrading AM/PM from the power amplifier. The lowerLimit is provided by system LUT 812 to configurable limiter 814 of FIG. 8.

The ET waveform construction according to the technology described herein provides for utilization of a slower switching supply. The complex envelope typically includes a high attack rate that would typically require a switcher to switch at high rate to account for the sharp increase in voltage. However, systems having slower switchers can adjust the slew rate of the ET envelope to conform to the switcher's profile. Additionally, the technology as described herein, allows for: a larger power amplification by-pass capacitor; more efficient filtering of the noise and switching products; utilization of the ET reference DAC with lower clock frequency (as compared with full bandwidth ET waveform support); reduced requirements for the post-DAC filter order and noise floor; more stable and predictable time alignment the ET supply waveform and RF envelope; and support for flexibility in the ET waveform synthesis that can be adapted to different hardware configurations.

In one or more embodiments, the power amplifier circuitry is operative in any of: a transmitter, a transceiver, a user equipment transceiver, a base station transceiver, an LTE transceiver or a MIMO transceiver.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "RF signal", "RF transmission signal", "RF transmit signal" and "RF reference signal" are considered interchangeable. The terms "ET waveform", "reference waveform" and "envelope tracking reference waveform" are considered interchangeable. The terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communications circuit comprising:
    power amplifier circuitry, the power amplifier circuitry including a communications signal input and a delayed version of the communications signal input;
    an envelope tracking waveform constructor configured to generate a shaped envelope tracking waveform of a communications signal based on: one or more operational parameters of the power amplifier circuitry and an analysis of a complex envelope of the delayed version of the communications signal to include anticipating peaks and troughs of the communication signal; and
    a power supply switcher configured to receive the shaped envelope tracking waveform and dynamically control power amplification of the communications signal according to the envelope tracking waveform.

2. The communications circuit of claim 1 wherein the one or more operational parameters comprises one or more of: power amplifier slew rate, power amplifier capacitor size, power amplifier discharge rate, power amplifier noise or power amplifier switcher agility.

3. The communications circuit of claim 1 further comprising: a configurable bandwidth low-pass filter to smooth the shaped envelope tracking waveform; a dynamic regulator to establish offset, scale and limits for the shaped envelope tracking waveform; a course and fine delay for alignment of the communications signal and the shaped envelope tracking waveform and a delay table to provide inputs to the course and fine delay; and an envelope tracking waveform digital-to-analog converter.

4. The communications circuit of claim 1 further comprising a portion of any of: a transmitter, a transceiver, a user equipment transceiver, a base station transceiver, an LTE transceiver or a MIMO transceiver.

5. A method to increase power amplifier circuitry efficiency, the method comprising:
in a first communications signal processing path, delaying and processing a communications signal;
in a second communications signal processing path, analyzing the delayed communications signal to:
generate a complex envelope;
generate an envelope tracking waveform substantially matching peaks of the generated complex envelope, wherein the envelope tracking waveform is shaped to account for one or more operational parameters of the power amplifier circuitry; and
coupling the shaped envelope tracking waveform to a power amplifier switcher of the power amplifier circuitry for modulating a supply voltage.

6. The method of claim 5 wherein the one or more operational parameters comprises one or more of power amplifier slew rate, power amplifier capacitor size, power amplifier discharge rate, power amplifier noise or power amplifier switcher agility.

7. The method of claim 5 further comprising low-pass filtering the shaped envelope tracking waveform.

8. The method according to claim 5 wherein the coupling of the shaped envelope tracking waveform further comprises aligning in time the envelope tracking waveform with the delayed communications signal during the modulation.

9. The method according to claim 5 wherein the analyzing the delayed communications signal further comprises: anticipating peaks and troughs of the communication signal.

10. The method according to claim 6 wherein the generation of the envelope tracking waveform substantially matching peaks of the generated complex envelope further comprises:
determining signal peaks within the generated complex envelope;
determining times to begin amplification changes of the power amplifier circuitry to substantially meet the determined signal peaks of the generated complex envelope based on the determined one or more operational parameters of the power amplifier circuitry; and
generating the envelope tracking waveform based on the determined times.

11. A communications circuit comprising:
power amplifier circuitry, the power amplifier circuitry including a communications signal input;
an envelope tracking waveform constructor configured to generate a shaped envelope tracking waveform of a communications signal based on one or more operational parameters of the power amplifier circuitry;
a configurable bandwidth low-pass filter to smooth the shaped envelope tracking waveform;
a dynamic regulator to establish offset, scale and limits for the shaped envelope tracking waveform;
a course and fine delay for alignment of the communications signal and the shaped envelope tracking waveform; and
a power supply switcher configured to receive the shaped envelope tracking waveform and dynamically control power amplification of the communications signal according to the envelope tracking waveform.

12. The communications circuit of claim 11 wherein the one or more operational parameters comprises one or more of: power amplifier slew rate, power amplifier capacitor size, power amplifier discharge rate, power amplifier noise or power amplifier switcher agility.

13. The communications circuit of claim 12 wherein the power amplifier slew rate includes a maximum attack slew rate less than a maximum attack slew rate of the power amplifier circuitry.

14. The communications circuit of claim 12 wherein the power amplifier slew rate waveform includes a maximum decay slew rate less than a maximum decay slew rate of the power amplifier circuitry.

15. The communications circuit of claim 11 further comprising: a delay table to provide inputs to the course and fine delay and an envelope tracking waveform digital-to-analog converter.

16. The communications circuit of claim 11 further comprising a portion of any of: a transmitter, a transceiver, a user equipment transceiver, a base station transceiver, an LTE transceiver or a MIMO transceiver.

17. A communications circuit comprising:
power amplifier circuitry, the power amplifier circuitry including a communications signal input;
an envelope tracking waveform constructor configured to generate a complex envelope of a delayed copy of the communications signal and further configured to generate an envelope tracking waveform of a communications signal based on one or more operational parameters of the power amplifier circuitry, wherein the generation of the envelope tracking waveform further includes substantially matching peaks of the generated complex envelope by:
determining signal peaks within the generated complex envelope;
determining times to begin amplification changes of the power amplifier circuitry to substantially meet the determined signal peaks of the generated complex envelope based on the one or more operational parameters of the power amplifier circuitry; and
generating the envelope tracking waveform based on the determined times; and
a power supply switcher configured to receive the generated envelope tracking waveform and dynamically control power amplification of the communications signal according to the envelope tracking waveform.

18. The communications circuit of claim 17 wherein the one or more operational parameters comprises one or more of: power amplifier slew rate, power amplifier capacitor size, power amplifier discharge rate, power amplifier noise or power amplifier switcher agility.

19. The communications circuit of claim 17 further comprising: a configurable bandwidth low-pass filter to smooth envelope tracking waveform; a dynamic regulator to establish offset, scale and limits for envelope tracking waveform; a course and fine delay for alignment of the communications signal and envelope tracking waveform and a delay table to provide inputs to the course and fine delay; and an envelope tracking waveform digital-to-analog converter.

20. The communications circuit of claim 17 further comprising a portion of any of: a transmitter, a transceiver, a user equipment transceiver, a base station transceiver, an LTE transceiver or a MIMO transceiver.

\* \* \* \* \*